(12) United States Patent
Sakuma et al.

(10) Patent No.: US 12,199,059 B2
(45) Date of Patent: Jan. 14, 2025

(54) SINTERING A NANOPARTICLE PASTE FOR SEMICONDUCTOR CHIP JOIN

(71) Applicant: International Business Machines Corporation, Armonk, NY (US)

(72) Inventors: Katsuyuki Sakuma, Fishkill, NY (US); Mukta Ghate Farooq, Hopewell Jct, NY (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 17/178,410

(22) Filed: Feb. 18, 2021

(65) Prior Publication Data

US 2022/0262754 A1    Aug. 18, 2022

(51) Int. Cl.
*H01L 21/768* (2006.01)
*H01L 21/48* (2006.01)
*H01L 21/56* (2006.01)
*H01L 21/66* (2006.01)
*H01L 21/68* (2006.01)
*H01L 23/00* (2006.01)
*H01L 23/31* (2006.01)
*H01L 23/488* (2006.01)
*H01L 23/495* (2006.01)
*H01L 23/522* (2006.01)
(Continued)

(52) U.S. Cl.
CPC .......... *H01L 24/11* (2013.01); *H01L 21/4825* (2013.01); *H01L 23/488* (2013.01); *H01L 23/53228* (2013.01); *H01L 24/14* (2013.01); H01L 2224/03462 (2013.01); H01L 2224/8184 (2013.01)

(58) Field of Classification Search
CPC ... H01L 24/11; H01L 21/4825; H01L 23/488; H01L 23/53228; H01L 24/14; H01L 2224/03462; H01L 2224/8184
See application file for complete search history.

(56) References Cited

U.S. PATENT DOCUMENTS 5,821,620 A * 10/1998 Hong .................. H01L 24/05
                                                                257/E21.582
6,255,949 B1    7/2001 Nicholson
6,400,016 B2    6/2002 Chen
(Continued)

FOREIGN PATENT DOCUMENTS

| CN | 102915985 A | 2/2013 | |
|---|---|---|---|
| JP | 2005203667 A | 7/2005 | |
| JP | 6255949 B2 * | 1/2018 | ............. H01L 24/81 |

OTHER PUBLICATIONS

Mizuno, et al., "Thermo-compression Micro Bonding technology using Au*—Au bonding technology using submicron Au particles Hybrid bonding technology of Au bumps and adhesives", Joining Technology for Manufacturing, 714 Journal of the Society of Precision Engineering vol. 79, No. 8, 2013, 5 pgs.

*Primary Examiner* — Nicholas J Tobergte
(74) *Attorney, Agent, or Firm* — Edward J. Wixted, III

(57) ABSTRACT

An approach to provide a method of joining a semiconductor chip to a semiconductor substrate, the approach includes depositing a nanoparticle paste and aligning each of one or more solder contacts on a semiconductor chip to a substrate bond pad. The approach includes sintering, in a reducing gaseous environment, the nanoparticle paste to connect the semiconductor chip to a semiconductor substrate bond pad.

10 Claims, 5 Drawing Sheets

(51) Int. Cl.
    *H01L 23/528*     (2006.01)
    *H01L 23/532*     (2006.01)

(56) References Cited

U.S. PATENT DOCUMENTS

| | | | |
|---|---|---|---|
| 9,129,840 | B2 | 9/2015 | Nashida |
| 9,246,073 | B2 | 1/2016 | Sasaoka |
| 9,960,097 | B2 | 5/2018 | Sakamoto |
| 11,122,692 | B1* | 9/2021 | Benedict .............. H05K 1/117 |
| 2005/0011016 | A1 | 1/2005 | Pasquier |
| 2008/0165982 | A1* | 7/2008 | Hankey ............... B21C 23/18 |
| | | | 381/74 |
| 2010/0035375 | A1* | 2/2010 | Grigoropoulos .......................... |
| | | | H01L 21/76838 |
| | | | 977/773 |
| 2010/0093131 | A1* | 4/2010 | Maeda ................. H01L 24/11 |
| | | | 257/E21.705 |
| 2013/0087910 | A1* | 4/2013 | Abdul Razak ........ H01L 24/14 |
| | | | 257/737 |
| 2015/0115018 | A1* | 4/2015 | Hori ..................... H01L 24/83 |
| | | | 252/514 |
| 2016/0271651 | A1* | 9/2016 | Petersen ................ B06B 1/06 |
| 2016/0351529 | A1* | 12/2016 | Brunschwiler ........ H01L 24/08 |
| 2017/0113306 | A1* | 4/2017 | Ghoshal .................. B22F 9/24 |
| 2017/0243849 | A1* | 8/2017 | Sasaki ..................... C09J 11/06 |
| 2017/0309549 | A1* | 10/2017 | Wachtler ............ H01L 23/49541 |
| 2018/0009998 | A1* | 1/2018 | Hsu ........................ H01B 1/22 |
| 2018/0374812 | A1* | 12/2018 | Aoki ................. H01L 23/49811 |
| 2018/0374813 | A1* | 12/2018 | Khazaka .............. H01L 21/4846 |
| 2019/0109084 | A1* | 4/2019 | Brunschwiler ......... H01L 24/16 |
| 2019/0206805 | A1* | 7/2019 | Hong ..................... C09D 201/00 |
| 2021/0185831 | A1* | 6/2021 | Rahimi ................... H05K 1/113 |
| 2021/0305187 | A1* | 9/2021 | Benedict ............... H01L 24/11 |

\* cited by examiner

SINTERING A NANOPARTICLE PASTE FOR SEMICONDUCTOR CHIP JOIN

BACKGROUND

The present invention relates generally to the field of semiconductor device technology and more particularly to semiconductor chip bonding by sintering particles in a nanoparticle particle paste.

In the manufacture of integrated circuits, there is a continuing desire to fit more semiconductor devices and circuits on semiconductor wafers. The drive for miniaturization and increasing circuit density is driven by several factors, including device speed, as denser circuits are closer together for fast communication, wafer utilization (more circuits per wafer), and potential semiconductor chip cost reduction as the number of semiconductor chips per wafer increase. With miniaturization and the desire for increasing circuits per wafer, more interconnections between circuit devices and more external I/O connections of the semiconductor chip to a substrate may be created.

SUMMARY

Aspects of an embodiment of the present invention disclose a method of joining a semiconductor chip to a semiconductor substrate, the method includes depositing a nanoparticle paste and aligning each of one or more solder contacts on a semiconductor chip to a substrate bond pad. The method includes sintering, in a reducing gaseous environment, the nanoparticle paste to connect each of the one or more solder contacts on the semiconductor chip to a semiconductor substrate bond pad.

Aspects of an embodiment of the present invention disclose a semiconductor chip joined to a semiconductor substrate by a sintered nanoparticle bond where the sintered nanoparticle bond includes a plurality of nanoparticles sintered to a lead-free solder on a semiconductor chip and a copper bond pad on a semiconductor substrate. The sintered nanoparticle bond is composed of one of gold, copper, tin, or silver.

DETAILED DESCRIPTION

Figure 1:
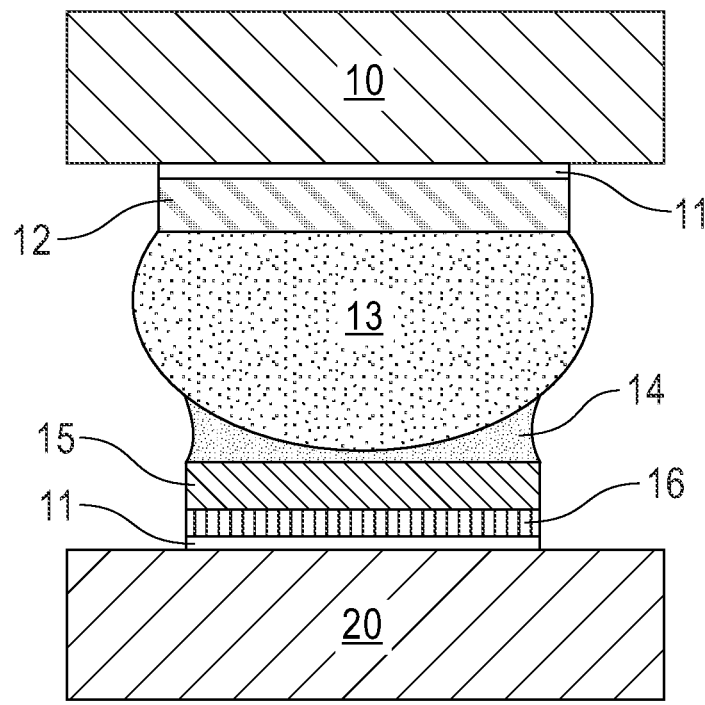
FIG. 1 depicts an illustration of a semiconductor chip to substrate attachment using sintered nanoparticles, according to an embodiment of the invention.

Embodiments of the present invention recognize that conventional semiconductor chip to semiconductor chip joining uses a gold plating or a gold layer on the top surface of a semiconductor chip bond pad that is joined or soldered to another semiconductor chip contact with a solder bump. The solder bump is typically a lead-free solder that is deposited on the top semiconductor chip bond pads or is deposited on a pillar structure, such as a plated or deposited copper pillar above a semiconductor chip contact pad or via.

Embodiments of the present invention recognize that gold is undesirable in a wafer fabrication line. When gold is introduced in a semiconductor chip manufacture, the gold can have detrimental effects on both back-end of the line (BEOL) and front-end of the line (FEOL) semiconductor structures. Embodiments of the present invention recognize that gold can damage or poison FEOL devices producing negative effects on completed semiconductor chip performance. Embodiments of the present invention recognize that the wafer may need to be moved to a semiconductor packaging manufacturing line or another place for the final gold or nickel/gold plating. When the final gold or nickel/gold pad plating occurs outside of the wafer fabrication line, the wafer with gold plated pads cannot re-enter the wafer fabrication line for any later processing. For this reason, it is beneficial to discover a method for an effective semiconductor chip to semiconductor chip joining process using materials and processes that enable successful chip joining of a solder bump on a semiconductor chip pad or successful chip joining of a solder coated copper pillar on a semiconductor chip to a copper pad on bottom semiconductor substrate or chip. An ability to use a semiconductor substrate without a gold or nickel/gold coated bond pad to join a top semiconductor chip with a solder bump, such as a controlled collapse chip connection (C4) is desirable. Additionally, it is beneficial to have a process for joining a semiconductor chip to an organic substrate that does not require a gold or nickel/gold coating on the organic substrate bond pad.

Embodiments of the present invention recognize that using a lead-free solder for joining a semiconductor chip to another substrate using a flip chip solder chip attach method typically requires temperatures in the range of 210 to 300 degrees. In some cases of chip to chip bonding, a flux is used to remove solder oxides from the solder bump surface and/or oxides from substrate bond pads. Embodiments of the present invention recognize that solder joints, especially when formed at higher temperatures, form intermetallics with the metals or metal alloys present in the semiconductor chip bond and the substrate bond pads. The intermetallics formed during the lead-free soldering process to attach the semiconductor chips to a substrate are brittle and reduce solder joint life. Temperature excursions occur during semiconductor chip and computer system operation on/off cycles create thermal related stress in the solder joint due to different rates of thermal expansion of the various materials in the semiconductor chip packaging (e.g., heat sinks, adhesives, semiconductor material, solder, printed circuit boards, etc.). The different thermal coefficient of expansion (TCE) of the different materials associated with the solder joint causes solder joint fatigue which can lead to solder chip joint failure, especially with increasing on/off cycles of the computer system or semiconductor chip Additionally, embodiments of the present invention recognize if a flux with reactive agents is used to solder the semiconductor chip to a substrate, then, after cleaning to remove the flux, flux residues which may contain some of the reactive agents or chemicals in the flux can remain. Embodiments of the present invention recognize removal of flux residues after semiconductor chip join using solder can be difficult. Cleaning processes and cleaning equipment to remove flux residue under low profile solder joints formed during chip join can leave undesirable flux residues.

Additionally, embodiments of the present invention recognize that semiconductor chips have a thermal budget and that increased temperature excursions or higher temperatures in chip joining consume a larger portion of the thermal budget. Increased diffusion of atoms and elements within the semiconductor chip occurs with each thermal exposure to high temperatures. The increased diffusion in the semiconductor chips due to thermal exposures reduces semiconductor chip performance and semiconductor chip life. Embodiments of the present invention recognize lower temperature processes for semiconductor chip join would be advantageous. Embodiments of the present invention recognize that another advantage of being able to perform bonding to a semiconductor chip with lead-free solders at low temperatures is that it reduces the occurrence of thermal stress in the bonding materials, the thermal stress inside the substrate, and outside the substrate, thus reducing problems such as fractures in the substrate and the bonding materials forming the semiconductor chip joint.

Embodiments of the present invention provide a method for semiconductor chip to semiconductor chip bonding without the presence of gold on semiconductor bond pads. The method also provides a low-temperature alternative to conventional lead-free solder chip joining methods. The method does not require flux to join a semiconductor chip with a solder bump to a non-gold coated semiconductor substrate bond pad. The method provides a semiconductor chip to semiconductor substrate bonding using the sintering of a nanoparticle paste to connect the lead-free solder bump or the solder coating on a pillar residing above or on the semiconductor chip pad to a bond pad on a semiconductor substrate. The sintering process using very small diameter nanoparticles in the nanoparticle paste occurs in a low oxygen, reducing environment at lower temperatures than conventional lead-free soldering processes. The sintering of the nanoparticle paste can occur in the reducing environment with an applied pressure at temperatures as low as 100 degrees Celsius, in some cases, with silver (Ag) or gold (Au) nanoparticles.

Embodiments of the present invention provide lower temperatures during chip joining temperatures that help to preserve the semiconductor chip thermal budget and improve semiconductor chip life and performance. The low temperatures during chip join using sintering of nanoparticle paste reduce thermal exposure and reduce diffusion of elements in the semiconductor devices of the semiconductor chip. Lower bonding temperatures for chip join also reduce the occurrence of thermal stress in the bonding materials and in the substrate, thus reducing problems such as substrate fractures or fractures in the semiconductor chip joint to the substrate.

Embodiments of the present invention with lower temperature sintering of a nanoparticle paste produces less brittle intermetallics in the lead-free solders. Solder joints with less brittle intermetallics provide better chip joint fatigue life than solder joints with a larger amount of intermetallics present.

Additionally, embodiments of the present invention provide a method of chip joining that can be applied to join semiconductor chips to both other semiconductor substrates or to a non-semiconductor substrate, such as a ceramic substrate, a high-density organic substrate, a glass substrate, a printed circuit board substrate, a flex cable, a leadframe, or another type of substrate material.

Embodiments of the present invention provide the sintering of nanoparticles to join one or more semiconductor chips to a semiconductor substrate or to a non-semiconductor substrate at temperatures lower than the typical temperatures utilized in lead-free soldering for semiconductor chip join. The method utilizes a gaseous reducing environment with low oxygen and pressure to provide a fluxless method of chip attach to a non-gold bond pad surface, such as a copper substrate bond pad using the nanoparticle paste.

Detailed embodiments of the claimed structures and methods are disclosed herein. The method steps described below do not form a complete process flow for manufacturing integrated circuits or for joining semiconductor chips to a substrate, such as a semiconductor substrate or a laminate substrate. The present embodiments can be practiced in conjunction with the integrated circuit fabrication and semiconductor chip assembly techniques currently used in the art, and only so much of the commonly practiced process steps are included as are necessary for an understanding of the described embodiments. The figures represent cross-section portions of semiconductor chips, chip join substrates, nanoparticle paste, and various methods of joining the semiconductor chips to the chip join substrates and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating, or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, the description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

The figures provide only illustrations of various implementations of the present invention and do not imply any limitations with regard to the environments in which different embodiments may be implemented. Implementation of embodiments of the invention may take a variety of forms, and exemplary implementation details are discussed subsequently with reference to the Figures. Many modifications to the depicted environment may be made by those skilled in the art without departing from the scope of the invention as recited by the claims.

FIG. 1 depicts an illustration of semiconductor chip 10 attached to substrate 20 using sintered nanoparticles 14, in accordance with at least one embodiment of the invention. As depicted, FIG. 1 includes semiconductor chip 10 with diffusion barrier 11, chip pad 12, solder bump 13, sintered nanoparticles 14 joining solder bump 13 to semiconductor substrate bond pad 15 on barrier 16 (optional), and diffusion barrier 11 on substrate 20 when substrate 20 is a semiconductor substrate or a second semiconductor chip. In various embodiments, a copper seed layer is deposited in the surface of semiconductor chip 10 (not depicted) or on substrate 20 before depositing diffusion barrier 11. In various embodiments, solder bump 13 is a controlled collapse chip connection, also known as a C-4. While semiconductor chip 10 is depicted with diffusion barrier 11, chip pad 12, and solder bump 13, the present invention is not limited to this semiconductor contact pad structure or materials. For example, any conventional contact layers, metals, or metal alloys used in a semiconductor chip interconnection pad and solder bump may be used with the present invention.

FIG. 1 depicts a bottom portion of semiconductor chip 10 with an interconnect pad or bond pad, for example, composed of diffusion barrier 11 and chip pad 12. A copper seed layer (not depicted) may be present on a surface of semiconductor chip 10 to promote diffusion barrier 11 adhesion to semiconductor chip 10. While a single interconnect pad formed with diffusion barrier 11 and chip pad 12 is depicted in FIG. 1, a plurality of interconnect pads with diffusion barrier 11 and chip pad 12 may be present on semiconductor chip 10. As depicted in FIG. 1, sintered nanoparticles 14 connect solder bump 13 to substrate bond pad 15 on substrate 20. In various embodiments, the connection of sintered nanoparticles 14 to solder bump 13 and substrate bond pad 15 forms a chip to chip interconnection for joining semiconductor chip 10 to a second semiconduction chip (i.e., substrate 20) using sintered nanoparticles 14. Semiconductor chip 10 may be any type of semiconductor chip, such as a memory chip (e.g., a static random-access memory or SRAM, a magnetoresistive random access memory or MRAM, etc.), a logic chip (e.g., a complementary metal-oxide-semiconductor chip or CMOS chip), an opto-electron device, a magnetic read and write head, etc. Semiconductor chip 10 may be formed with any type of semiconductor substrate or wafer including but, not limited to silicon, silicon germanium, a group IV semiconductor material, a group III-V semiconductor material, a group II-VI semiconductor material, a silicon on insulator (SOI), or other known semiconductor material used in semiconductor chips.

In various embodiments, diffusion barrier 11 is composed of a layer of titanium (Ti), tungsten (W), or TiW but, is not limited to these materials. Diffusion barrier 11 may be composed of other materials or metals used in semiconductor manufacture for a diffusion barrier layer in a semiconductor chip interconnect pad (e.g., chip pad 12).

In various embodiments, chip pad 12 is composed of copper. In some embodiments, chip pad 12 is composed of a copper alloy or another metal. Chip pad 12 may be deposited and patterned with known semiconductor interconnect formation processes, which may occur at the back end of the line (BEOL). In some embodiments, the chip pad 12 and solder bumps 13 are formed by an electroplating process. In various embodiments, chip pad 12 is formed for a controlled collapse chip connection (C4). In these embodiments, solder bump 13 may have a solder bump size, shape, chip pad 12 spacing, and metallurgy suitable for C4 deposition. For example, a spacing or pitch between chip pad 12 and an adjacent chip pad 12 can be 55-150 micrometers (μm) but, is not limited to this pitch. In some embodiments, chip pad 12 has a size, shape, pad spacing, and metallurgy suitable for non-C4 solder bump deposition using known solder bump deposition processes, such as electroplating.

Solder bump 13 can be a solder contact for semiconductor chip 10. Solder bump 13 can be deposited on chip pad 12 on the top side of the semiconductor wafer during the final wafer processing step. In various embodiments, solder bump 13 is a C4. In other embodiments, solder bump 13 is a non-C4 solder bump. For example, using known processes, solder bumps 13 also may be formed by the ball drop method where the ball drop method uses a stencil and a ball dispense unit to place solder balls on the semiconductor substrate for subsequent solder reflow to form solder bump 13. In various embodiments, solder bump 13 is composed of a lead-free solder. For example, solder bump 13 may be composed of a tin (Sn) silver (Ag) alloy, containing less than 3% Ag, e.g. Sn1.8% Ag but, is not limited to this alloy or composition. Solder bump 13 can be composed of any metal material used in semiconductor chip join.

In various embodiments, sintered nanoparticles 14 are composed of copper nanoparticles, silver nanoparticles, gold nanoparticles, or combinations of these materials. In other embodiments, sintered nanoparticles 14 are composed of other metals, such as a combination of tin nanoparticles and copper nanoparticles or a combination of tin and silver nanoparticles. In an embodiment, the nanoparticle paste is composed of a solder alloy, such as a tin-silver (SnAg) solder alloy, a tin-gold (SnAu) solder alloy, or a tin-copper (SnCu) solder alloy in an inert carrier. During the sintering process, the very small nanoparticles in the nanoparticle paste create high surface energy for a high driving force that reduces the thermodynamic energy for sintering. By reducing the thermodynamic energy needed during sintering, the nanoparticles are fused or sintered together at temperatures far below a melting point for copper. For example, sintered nanoparticles 14 can be formed at temperatures as low as 100-150 degrees Celsius with very small diameter nanoparticles in a reducing environment. For example, sintering of Au nanoparticles with 20 nanometers (nm) diameters to attach to solder bump 13 can occur in a reducing environment, such as formic acid, with an applied pressure at temperatures as low as one hundred degrees Celsius.

Sintered nanoparticles 14 are not only joined together or fused during the sintering process but, also connect or join to solder bump 13 and to substrate pad 15. For example, sintered nanoparticles 14 can be formed at temperatures in the range of 100 degrees Celsius to 200 degrees Celsius or higher under applied pressure and in a reducing gaseous environment. In various embodiments, sintered nanoparticles 14 provide a solder to sintered gold nanoparticle or solder to sintered silver nanoparticle bond to solder bump 13 joint and a sintered gold or silver nanoparticle bond to a copper substrate bond pad, such as substrate pad 15 at low sintering temperatures (e.g., 100-200 degrees Celsius). In some embodiments, sintered nanoparticles 14 provide a solder bump 13 to copper nanoparticle joint with sintered nanoparticles 14 and a copper nanoparticle to copper bond pad with substrate pad 15 using sintered copper nanoparticles 14 at relatively low sintering temperatures. Using the sintering process for the nanoparticle paste in a reducing environment with pressure, semiconductor chip 10 attachment to substrate 20 can occur without a need for a gold-coated bond pad surface on substrate bond pad 12.

Sintered nanoparticles 14 can be formed during sintering using temperatures in the range of 100-200 degrees Celsius in a reducing environment (e.g., a gaseous formic acid or other forming gas). Pressure may be applied to an exposed surface of semiconductor chip 10 or substrate 20 during sintering.

As depicted, substrate bond pad 15 resides on substrate 20. In various embodiments, substrate bond pad 15 is composed of copper. In an embodiment, substrate bond pad 15 is not limited to copper but, is another non-gold metal or metal alloy. The joining of semiconductor chip 10 to substrate 20 using the sintering process disclosed in the present invention does not require a gold surface on substrate bond pad 15. In various embodiments, the substrate bond pad pitch ranges from 55-150 μm but, is not limited to this pitch. In an embodiment, substrate bond pad 15 is on substrate 20 which is a non-semiconductor substrate. Substrate bond pad 15 connects to solder bump 13 and bond pad 12 through sintered nanoparticles 14.

In various embodiments, substrate 20 is composed of a semiconductor material. The semiconductor material can be the same or similar to the material in semiconductor chip 10 (e.g., may be composed of the same semiconductor substrate materials with the same diffusion barrier material). In one embodiment, semiconductor substrate 20 is a semiconductor substrate composed of different semiconductor materials than semiconductor chip 10. For example, semiconductor chip 10 is a silicon or a silicon-germanium semiconductor chip and substrate 20 is an SOI substrate that is a semiconductor substrate, a semiconductor chip, or a portion of a wafer. In various embodiments, substrate 20 is a semiconductor chip for chip to chip bonding. In some embodiments, substrate 20 is a wafer or a portion of a wafer. One or more semiconductor chips 10 may be bonded to substrate 20 using the sintering process. In an embodiment, substrate 20 is a non-semiconductor substrate (e.g., a PCB, an organic substrate, a glass substrate, a ceramic material, a flex cable, etc.).

Substrate bond pad 15 can be deposited and/or patterned with known manufacturing methods such as copper plating. Substrate bond pad 15 connects or joins to sintered nanoparticles 14. While conventional chip joining methods, such as C4 or solder bump chip attach using soldering may typically require gold plating or a protective gold layer on substrate bond pad 12 to prevent the formation of oxides on the substrate bond pad surface, as depicted in FIG. 1, substrate bond pad 15 does not require a gold plating or gold coating. As previously discussed, gold (Au) or a NiAu coating of substrate bond pad 15 are typically not allowed in a wafer fabrication line due to potential damage to the functionality of the semiconductor chip (e.g., possible damage to FEOL semiconductor device structures and BEOL semiconductor chip structures). For at least this reason, chip to chip joining of solder bumps 13 (e.g., C4s) on semiconductor chip 10 with the non-Au coated substrate bond pad 15 on substrate 20 using sintered nanoparticles 14 is advantageous.

Similarly, when substrate bond pad 15 is on a non-semiconductor material for substrate 20 (e.g., substrate 20 is a PCB), the sintering process in the reducing environment can create an effective chip to substrate joint with sintered nanoparticles 14 that does not require a gold-coated substrate bond pad 15 or otherwise protectively coated substrate bond pad 15 (e.g., a protective organic bond pad coating on a PCB substrate bond pad 15 may not be needed).

In various embodiments, barrier 16 resides between substrate bond pad 15 and diffusion barrier 11. Barrier 16 can be a layer of nickel (Ni) or another metal or metal alloy which can be used as a barrier layer under a bond pad. Barrier 16 can be plated on substrate bond pad 15 but, is not limited to Ni or a plating deposition (e.g., could be chemical vapor deposition (CVD), etc.). In some embodiments, barrier 16 is not present.

In various embodiments, diffusion barrier 11 separates barrier 16 from substrate 20. Diffusion barrier 11 can be on substrate 20 (e.g., on a contact or via pad in substrate 20). When substrate 20 is composed of a semiconductor material and sintered nanoparticles 14 are used for semiconductor chip to chip bonding, diffusion barrier 11 can be present on a top surface of substrate 20. As previously discussed, diffusion barrier 11 may be a layer of Ti, TiW, W, or other known semiconductor barrier layer material. In some cases, a copper seed layer (not depicted) may be deposited on the surface of substrate 20 under diffusion barrier 11.

In some embodiments, when another non-semiconductor substrate material (e.g., a PCB, a ceramic chip carrier, etc.) is used for substrate 20 then, diffusion barrier 11 may not be present under barrier 16 or substrate bond pad 15. For example, when substrate 20 is a ceramic or PCB substrate, substrate bond pad 15 may reside directly on substrate 20 or another commonly used under bond pad metal or metal alloy.

Sintered nanoparticles 14 connect solder bump 13 to substrate bond pad 15 on substrate 20 in a chip to chip interconnection. As previously discussed, sintered nanoparticles 14 allow the elimination of a gold layer on substrate bond pad 15 for chip to chip joining of semiconductor chip 10 to substrate 20 is desirable.

As discussed above, in some embodiments, semiconductor chip 10 with solder bump 13 connects through sintered nanoparticles 14 to substrate bond pad 15 residing on another type of substrate material (i.e., PCB substrate or a flexible cable substrate) for substrate 20. In these cases, diffusion barrier 11 may not be present on a non-semiconductor substrate 20. A gold coating or NiAu plating of substrate bond pad 15 on substrate 20 composed of a non-semiconductor material may not be required to form substrate 20 to semiconductor chip 10 connection with sintered nanoparticles 14.

Figure 2:
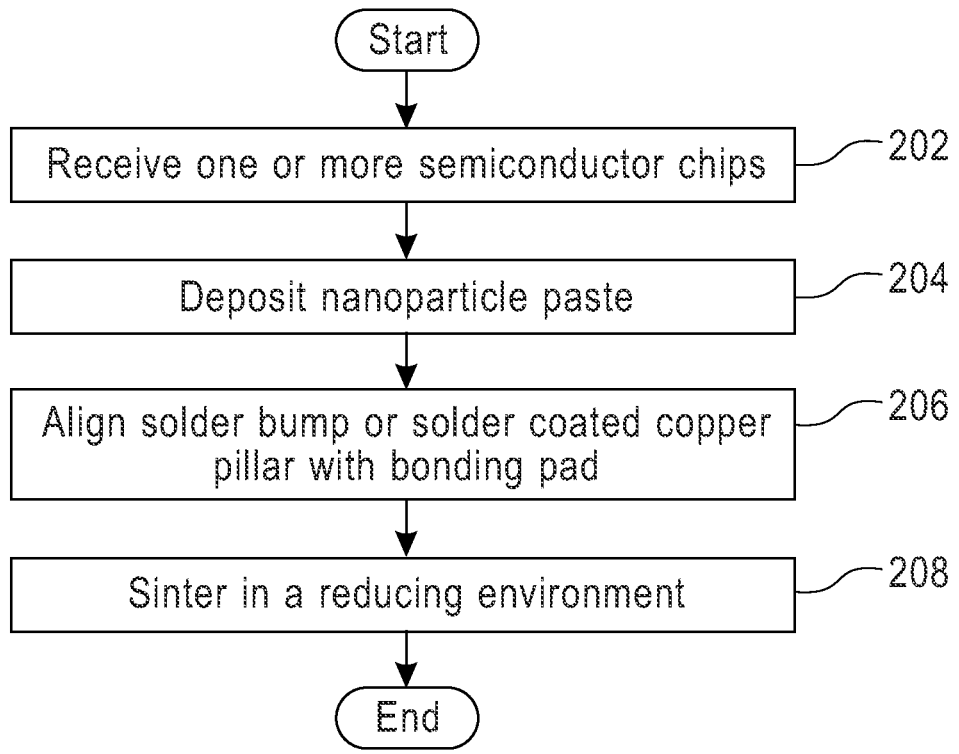
FIG. 2 is a flow chart depicting a method to attach a semiconductor chip to a substrate using sintering, according to an embodiment of the invention.

FIG. 2 is a flow chart depicting a method to attach semiconductor chip 10 to substrate 20 using sintering, according to an embodiment of the invention. The method to attach semiconductor chip 10 to substrate 20 includes the method to attach semiconductor chip 10 to another semiconductor chip, such as substrate 20 in chip to chip joining and also, includes a method to attach semiconductor chip 10 to substrate 20 composed of a non-semiconductor material, such as a PCB substrate in a laminate semiconductor chip package.

In step 202, the method includes receiving, at a chip assembly plant or a PCB assembly manufacturing process line, one or more semiconductor chips. For example, semiconductor chip 10 and substrate 20 may be received for chip join.

As previously discussed for chip to chip joining (i.e., when both semiconductor chip 10 and substrate 20 are semiconductor chips), the received semiconductor chips may have typical chip metallization and pads for chip joining (e.g., diffusion barrier 11, an optional Ni barrier 16, and Cu pads for chip bond pad 12 and substrate bond pad 15). The received semiconductor chips do not require a gold or NiAu surface on the semiconductor chip or semiconductor substrate bond. The semiconductor chips may have one of a lead-free solder bump (e.g., solder bump 13 which may be a C4), a copper pillar with a lead-free solder coating (depicted in FIG. 6), or a bond pad (e.g., substrate bond pad 15 depicted in FIG. 1).

In step 204, the method includes depositing the nanoparticle paste. In various embodiments, the nanoparticle paste is deposited on one of the solder bump (i.e., solder bump 13), on a solder coating on a copper pillar (solder 18 on pillar 17 depicted in FIG. 6), or on a substrate bond pad (e.g., substrate bond pad 15 on substrate 20 in FIG. 1). In one embodiment, the nanoparticle paste is deposited on both the solder bump (e.g., solder bump 13) and on the substrate bond pad (e.g., substrate bond pad 15).

In various embodiments, the nanoparticle paste is composed of an inert carrier with one or more of the following nanoparticles: gold nanoparticles, silver nanoparticles, or copper nanoparticles. In an embodiment, the nanoparticle paste is composed of a solder alloy, such as a tin-silver (SnAg) solder alloy or a tin-gold (SnAu) solder alloy or a tin-copper (SnCu) solder alloy in an inert carrier. In various embodiments, the nanoparticle paste includes nanoparticles with very small diameters (e.g., in the range of 2 nm to 300 nm).

In some embodiments, the nanoparticle paste is deposited on C4's (e.g., solder bump 13 on semiconductor chip 10) by dipping or immersing the top portion of the C4's or the tops of the solder coated copper pillars into a container or tub holding the nanoparticle paste. In other embodiments, the nanoparticle paste is deposited by a syringe on the substrate bond pad (e.g., on substrate bond pad 15 on substrate 20). For example, a controlled amount or volume of the nanoparticle paste may be dispensed by the syringe in an automated dispense tool with a vision system for alignment using known deposition methods. In an embodiment, the nanoparticle paste is deposited on the solder bump or solder coated pillar with the syringe. In some embodiments, the nanoparticle paste is screened onto the substrate bond pads using a screening tool or automated screener. In an embodiment, the nanoparticle paste is deposited on both the solder surface (e.g., on the C4 solder bump or on the solder coating on the copper pillar).

In various embodiments, the nanoparticle paste includes very small nanoparticles in an inert carrier, such as water or various organic solvents such as ethanol or mineral oil. For example, the gold nanoparticles in the nanoparticle paste are less than 2 micrometers (μm). The very small size of the nanoparticles is important as smaller nanoparticles can create increased surface energy during sintering.

In step 206, the method includes aligning solder bumps on the top semiconductor chip with substrate bond pads on a bottom semiconductor chip or substrate. For example, using known a chip join alignment system, a chip placement tool can be used to align solder bumps 13 on semiconductor chip 10 with substrate bond pad 15 on substrate 20 below semiconductor chip 10. In some embodiments, the chip join alignment tool aligns solder coated copper pillars (depicted in FIG. 6) with substrate bond pads 15.

In step 208, the method includes sintering in a reducing environment. Sintering the deposited nanoparticle paste to join semiconductor chip 10 to substrate 20 includes, in a reducing environment, lowering the top semiconductor chip (e.g., semiconductor chip 10) so that the nanoparticle paste contacts substrate bond pad 15, heating the nanoparticle paste to a temperature in the range of 100 to 200 degrees Celsius and applying a light pressure to the top surface of semiconductor chip 10 to sinter the copper nanoparticles in the nanoparticle paste to form a chip to chip connection between semiconductor chip 10 and substrate 20.

In various embodiments, the reducing environment is a formic acid gas (i.e., hydrogen dioxide carbon dioxide gas $H_2CO_2$ with an HCOOH structure) with a low oxygen level (e.g., less than 100 ppm oxygen). In other examples, the reducing environment is another reducing gas (e.g., forming gas in nitrogen) with a low oxygen level (e.g., less than 100 ppm). The sintering process can occur over a range of temperatures, pressures, and dwell times that is dependent on the materials used (e.g., the metal in the nanoparticles and the composition of the inert carrier) and the desired resistivity of the chip joint after sintering. In general, higher sintering temperatures and longer dwell times can reduce the resistivity of the sintered nanoparticles. For example, for a sintering process using Au nanoparticles, successful chip to chip bonding can occur with pressure, such as a load of 50 MPa, a bonding temperature of 200° C., and bonding time or dwell time of 30 minutes. In another example, using silver nanoparticles in the nanoparticle paste with a sintering temperature of 180° C. that is held for 60 minutes can result in a chip joint with a resistance of 10 μΩ-cm or less. In other examples, a higher resistivity chip joint can be formed when 20 nm diameter Au nanoparticles are sintered in the reducing environment under pressure at temperatures in the 100 to 120 degrees Celsius range. However, the sintering process is not limited to these pressures, temperatures, and hold times. During sintering, after holding the temperature and pressure in the reducing environment (e.g., formic acid gas), the nanoparticles fuse or join together forming a sintered joint between the semiconductor chips (e.g., between solder bump 13 and substrate bond pad 15 depicted in FIG. 1).

As previously discussed, metal nanoparticles, such as Au, Ag, Cu in the range of 2 nm to 300 nm can produce very high surface energies during sintering. The surface energy can produce a large driving force that reduces the thermodynamic energy needed for chip joining during sintering. The significantly reduced thermodynamic energy allows effective sintering and chip join to occur at relatively low temperatures. Using very small metal nanoparticles in the nanoparticle paste allows chip joining at temperatures below conventional chip join temperatures of 220-300 degrees Celsius for no-lead solders, such as SnAgCu solders with a melting temperature greater than 220 degrees Celsius. Successful sintering of very small metal nanoparticles, for example with diameters less than 2 nm-300 nm, using the nanoparticle paste for chip join can occur at temperatures as low as 100-150 degrees Celsius, which is significantly below current conventional chip join temperatures of typical lead-free solders.

Figure 6:
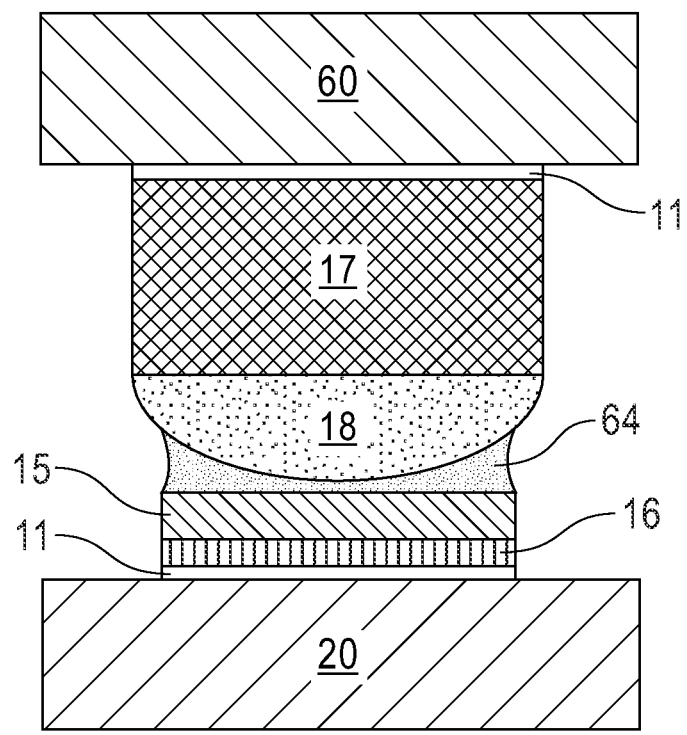
FIG. 6 is an illustration of a semiconductor chip pad attached to a pillar with a solder coating bonded to a semiconductor substrate pad using sintered nanoparticles, according to an embodiment of the present invention.

In other embodiments, the method discussed in steps 202-208 is performed to create chip to chip joining between semiconductor chip 60 and substrate 20 depicted in FIG. 6. In this case, the method joins two chips (e.g., semiconductor chip 60 with pillar 17 coated with solder 18 and substrate 20) using sintering of the nanoparticle paste with the processes as discussed above. In this case, essentially the same sintering process with the same range of temperatures, pressures, and hold times in a reducing environment can be used to form the sintered chip to chip connection between semiconductor chip 60 and substrate 20 using the nanoparticles.

In some embodiments, substrate 20 is a non-semiconductor substrate, such as a PCB substrate. In this case, as previously discussed, diffusion barrier 11 may not be present and substrate bond pad 15 resides on the PCB surface or another non-semiconductor substrate surface. The method discussed above in steps 202-208 for chip join using sintering of the nanoparticle paste is essentially the same (e.g., methods of depositing the nanoparticle paste, aligning solder bumps to substrate bond pads, and sintering the nanoparticle paste). In these embodiments, the method provides a method of joining a chip to a non-semiconductor substrate, such as a ceramic or PCB substrate, using sintering of the nanoparticle paste.

Figure 3A:
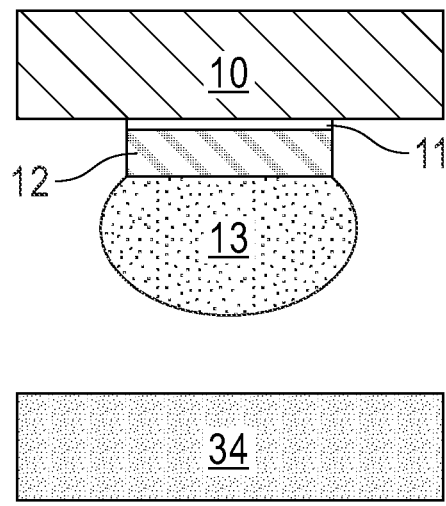
FIG. 3A is an illustration of a cross-sectional view of the semiconductor chip with a solder bump and a nanoparticle paste, according to an embodiment of the present invention.

FIG. 3A is an illustration of a cross-sectional view of semiconductor chip 10 with solder bump 13 and nanoparticle paste 34, according to an embodiment of the present invention. In various embodiments, nanoparticle paste 34 with very small nanoparticles in an inert carrier is in an open-top container exposing the top surface of the nanoparticle paste 34. Nanoparticle paste 34 can include gold, silver, or copper nanoparticles with a very small diameter (e.g., in the range 2 nm-300 nm diameter). In one embodiment, nanoparticle paste 34 can include silver and gold nanoparticles instead of or combined with tin nanoparticles.

Figure 3B:
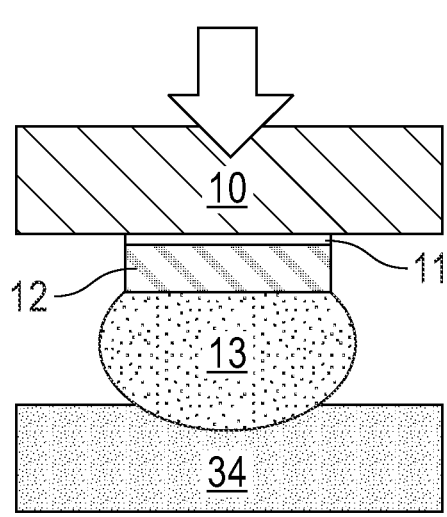
FIG. 3B is an illustration of a cross-sectional view of the semiconductor chip with the solder bump being dipped into the nanoparticle paste, according to an embodiment of the present invention.

FIG. 3B is an illustration of a cross-sectional view of semiconductor chip 10 with solder bump 13 being dipped into nanoparticle paste 34, according to an embodiment of the present invention. In various embodiments, semiconductor chip 10 is lowered until solder bump 13 contacts the top surface of nanoparticle paste 34. For example, an automated tool may lower semiconductor chip 10 until solder bump 13 dips into nanoparticle paste 34.

Figure 3C:
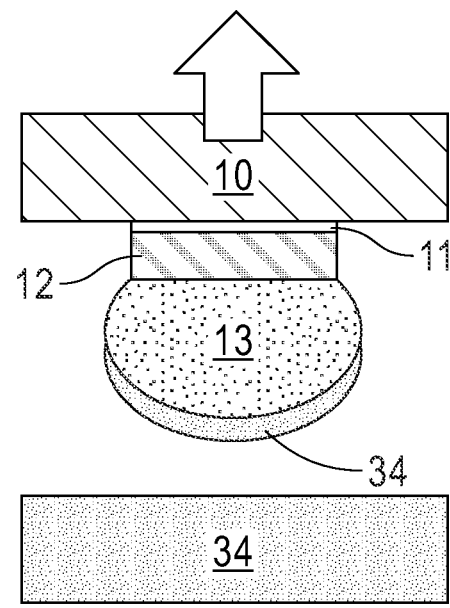
FIG. 3C is an illustration of a cross-sectional view of the semiconductor chip with the solder bump after nanoparticle paste deposition on the solder bump, according to an embodiment of the present invention.

FIG. 3C is an illustration of a cross-sectional view of semiconductor chip 10 with solder bump 13 after nanoparticle paste 34 deposition on solder bump 13, according to an embodiment of the present invention. In various embodiments, semiconductor chip 10 raises, and a portion of nanoparticle paste 34 remains on solder bump 13. For example, the automated tool lifts semiconductor chip 10 above the surface of nanoparticle paste 34 and when semiconductor chip 10 removes solder bump 13 from the surface of nanoparticle paste 34, a portion of nanoparticle paste 34 remains on the bottom surface of solder bump 13.

As discussed above in detail with regard to FIG. 2, in various embodiments, solder bump 13 with the coating of nanoparticle paste 34 over the bottom portion of solder bump 13 is placed in a chip join alignment tool to align solder bump 13 with a substrate pad, such as substrate bond pad 15. As discussed above with regard to FIG. 2, the sintering of nanoparticle paste 34 can occur to join semiconductor chip 10 to substrate 20.

Figure 4A:
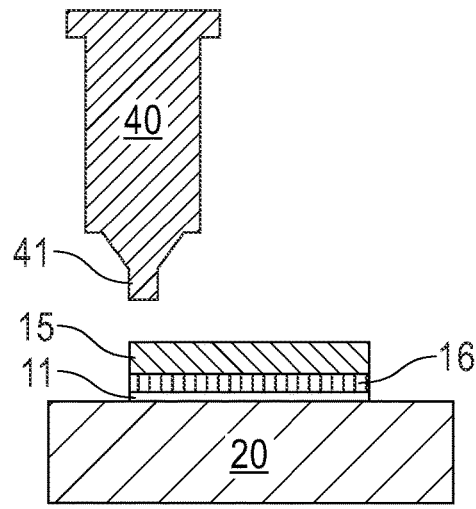
FIG. 4A is an illustration of a cross-sectional view of a substrate pad and a syringe containing the nanoparticle paste, according to an embodiment of the present invention.

FIG. 4A is an illustration of a cross-sectional view of substrate pad 15 and syringe 40 containing nanoparticle paste 34, according to an embodiment of the present invention. As depicted, FIG. 4A includes syringe 40 with needle 41 holding nanoparticle paste 34 over substrate pad 15. Substrate 20 is a semiconductor chip. In other embodiments, substrate 20 is a non-semiconductor substrate (e.g., PCB, etc.) with barrier 16 or substrate bond pad 15 deposited directly on the top surface of substrate 20 (e.g., a PCB).

Figure 4B:
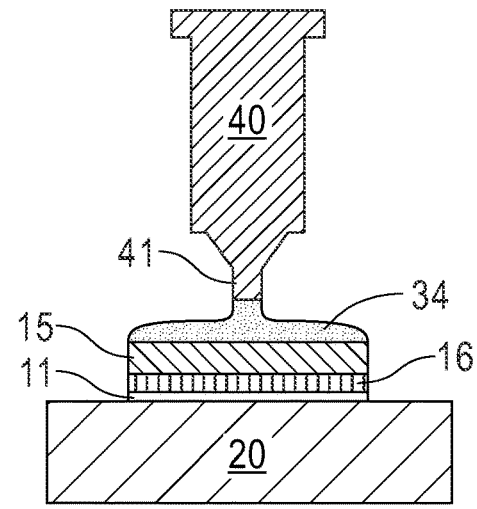
FIG. 4B is an illustration of a cross-sectional view of the substrate pad and the syringe depositing the nanoparticle paste on the substrate pad, according to an embodiment of the present invention.

FIG. 4B is an illustration of a cross-sectional view of substrate pad 15 and syringe 40 depositing nanoparticle paste 34 on substrate pad 15, according to an embodiment of the present invention. For example, an automated nanoparticle paste dispense tool aligns needle 41 over substrate bond pad 15 and dispenses a controlled amount of nanoparticle paste 34. The automated nanoparticle paste dispense tool may include at least a vision system, an air or gas compressor, a control panel to set dispense pressure, dispense amount, and/or dispense time, and a mechanical motor to move syringe 40. The automated nanoparticle dispense tool may be an off-shelf dispense tool, a customized off-the-shelf tool, or a custom-designed tool.

Figure 4C:
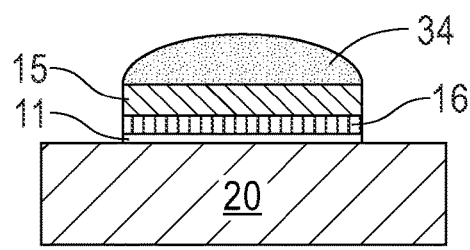
FIG. 4C is an illustration of a cross-sectional view of the substrate pad after depositing the nanoparticle paste on the substrate pad, according to an embodiment of the present invention.

FIG. 4C is an illustration of a cross-sectional view of substrate pad 15 after depositing nanoparticle paste 34 on substrate pad 15, according to an embodiment of the present invention. For example, the automated nanoparticle paste dispense tool dispenses a controlled amount of nanoparticle paste 34 and then, syringe 40 with needle 41 is moved up. The amount of nanoparticle paste 34 dispensed provides an adequate nanoparticle paste 34 above the top surface of substrate bond pad 15 to allow solder bump 13 (not depicted) to contact and compress the deposited nanoparticle paste 34 during sintering of nanoparticle paste 34 on solder bond pad 15 connecting to solder bump 13. The sintering of deposited nanoparticle paste 34 using the sintering process discussed above with reference to FIG. 2 forms sintered nanoparticles 14 joining substrate 20 to semiconductor chip 10 as depicted in FIG. 1.

Figure 5A:
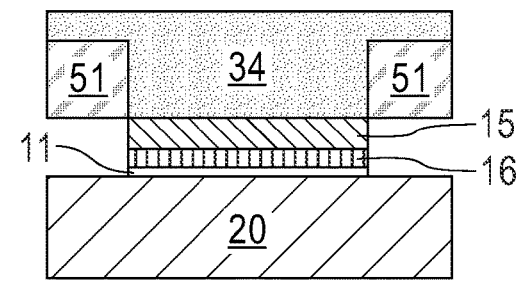
FIG. 5A is an illustration of a cross-sectional view of the substrate pad and a stencil in a stencil screener with nanoparticle paste on the screen, according to an embodiment of the present invention.

FIG. 5A is an illustration of a cross-sectional view of substrate pad 15 and stencil 51 in a screen printer with nanoparticle paste 34 on stencil 51, according to an embodiment of the present invention. As depicted, using known screen-printing processes and tools, the screen printer (not depicted) aligns the openings in stencil 51 with substrate pad 15, and nanoparticle paste 34 is deposited over stencil 51. Nanoparticle paste 34 can be over stencil 51 and fills the openings in stencil 51.

Figure 5B:
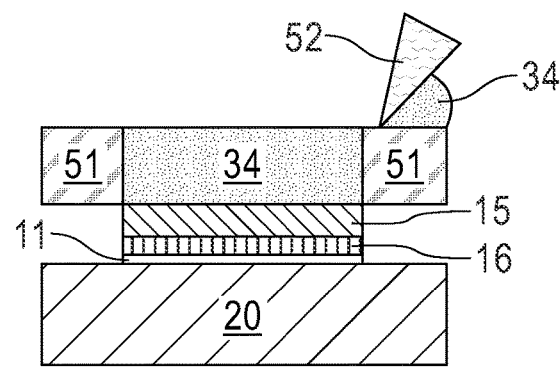
FIG. 5B is an illustration of a cross-sectional view of the substrate pad and a squeegee blade of the stencil printer removing excess nanoparticle paste from the stencil screener, according to an embodiment of the present invention.

FIG. 5B is an illustration of a cross-sectional view of substrate pad 15 and squeegee blade 52 of the stencil printer removing excess nanoparticle paste 34 from stencil 51, according to an embodiment of the present invention. Using known screen-printing methods, squeegee blade 52 removes excess nanoparticle paste 34 from the top surface of solder pad 15 and stencil 51.

Figure 5C:
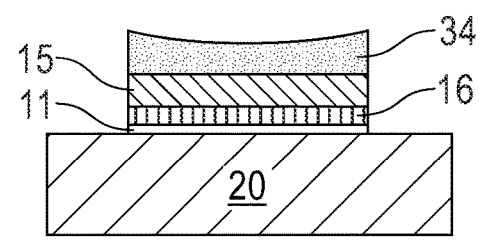
FIG. 5C is an illustration of a cross-sectional view of the substrate pad after depositing the nanoparticle paste on the substrate pad using the stencil printer, according to an embodiment of the present invention.

FIG. 5C is an illustration of a cross-sectional view of substrate pad 15 after depositing nanoparticle paste 34 on substrate pad 15 using the screen printer, according to an embodiment of the present invention. After removing excess nanoparticle paste 34 and lifting stencil 51, a portion of nanoparticle paste 34 resides on substrate pad 15. The amount of nanoparticle paste 34 after completing screen printing has sufficient paste height to allow chip joining of substrate 20 to solder bump 13 on semiconductor chip 10 using the processes discussed with respect to FIG. 2 to form sintered nanoparticles 14 in FIG. 1.

FIG. 6 is an illustration of semiconductor chip 60 bonded to substrate pad 15 using sintered nanoparticles 64, according to an embodiment of the present invention. As depicted, FIG. includes semiconductor chip 60 with diffusion barrier 11, pillar 17 coated with solder 18 joined by sintered nanoparticles 64 connected to substrate bond pad 15, barrier 16, diffusion barrier 11 on the top surface of substrate 20. In various embodiments, semiconductor chip 60 is a semiconductor chip with pillar 17 on diffusion barrier 11. For example, pillar 17 can be a copper pillar that can be coated with a lead-free solder. As depicted in FIG. 6, the bottom surface of pillar 17 is coated with solder 18. Pillar 17 with solder 18 can be a typical semiconductor structure for flip chip or semiconductor chip join. For example, solder 18 may be composed of SnAg, or Sn but is not limited to these lead-free solders or elements. In some embodiments, there is also a barrier metal layer such as Ni between pillar 17 and solder 18.

As depicted in FIG. 6, substrate 20 can be a semiconductor substrate essentially the same as substrate 20 in FIG. 1. Substrate 20 does not include a gold layer on substrate bond pad 15. Substrate 20 and semiconductor chip 60 utilize sintered nanoparticles 64 to provide a chip to chip bond.

In other embodiments, substrate 20 is composed of a non-semiconductor substrate material. For example, substrate 20 can be a flex cable, a PCB substrate, a ceramic substrate, or another non-semiconductor material substrate. In these embodiments, when substrate 20 is not composed of a semiconductor material, diffusion barrier 11 may not be present.

Figure 7A:
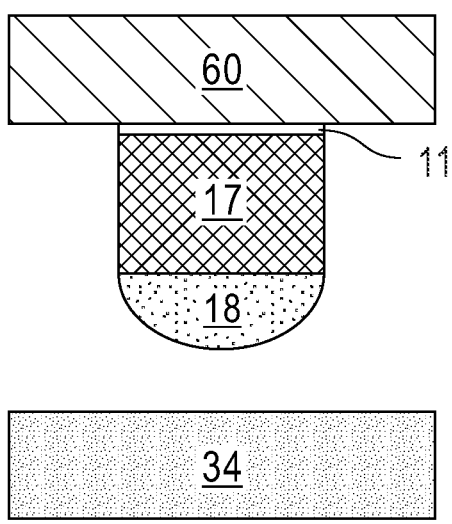
FIG. 7A depicts an illustration of the nanoparticle paste and the solder coated pillar on the semiconductor chip, according to an embodiment of the invention.

FIG. 7A depicts an illustration of nanoparticle paste 34 and solder 18 coating pillar 17 on semiconductor chip 60, according to an embodiment of the invention. In various embodiments, solder 18 is a lead-free solder on pillar 17. Pillar 17 may be a copper pillar plated on semiconductor chip 60. Pillar 17 may be composed of a known metal for a pillar in semiconductor chip attach and may be deposited by another method. As depicted, diffusion barrier 11 may be on semiconductor chip 60. Nanoparticle paste 34 may be composed of gold, silver, or copper nanoparticles in an inert carrier that is an open-top container or tub (not depicted). In one embodiment, nanoparticle paste 34 is composed of solder alloy of SnAg or SnAu or SnCu in the inert carrier.

Figure 7B:
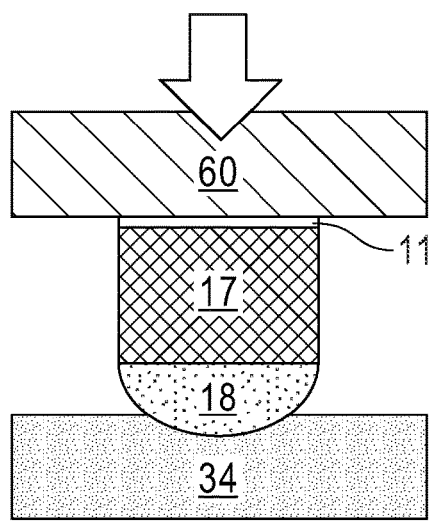
FIG. 7B depicts an illustration of the solder coated pillar on the semiconductor chip dipping into the nanoparticle paste, according to an embodiment of the present invention.

FIG. 7B depicts an illustration of pillar 17 coated with solder 18 dipping into nanoparticle paste 34, according to an embodiment of the present invention. An automated tool (not depicted) may lower semiconductor chip 60 until the top portion of solder 18 is immersed in a top portion of nanoparticle paste 34.

Figure 7C:
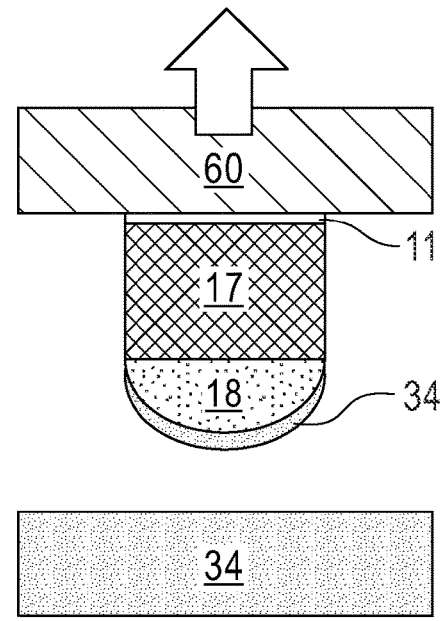
FIG. 7C depicts an illustration of the solder coated pillar on the semiconductor chip after depositing the nanoparticle paste on the solder coated pillar, according to an embodiment of the present invention.

FIG. 7C depicts an illustration of solder 18 on pillar 17 after depositing nanoparticle paste 34 on solder 18, according to an embodiment of the present invention. The automated tool may raise semiconductor chip 60 so that solder 18 is no longer in the container holding nanoparticle paste 34. A portion of nanoparticle paste 34 remains on solder 18.

Figure 8A:
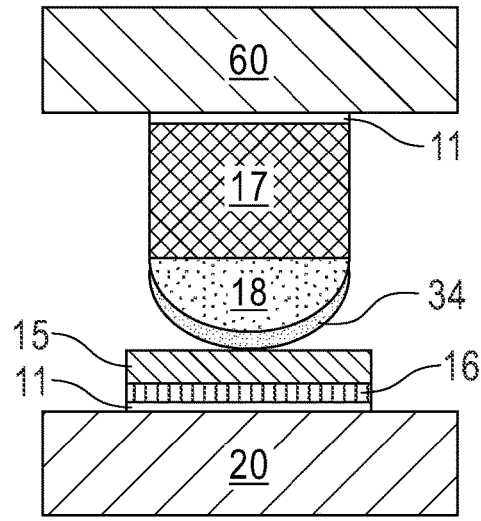
FIG. 8A is an illustration of aligning the solder coated pillar with the nanoparticle paste to a substrate pad, according to an embodiment of the present invention.

FIG. 8A is an illustration of aligning pillar 17 with solder 18 and nanoparticle paste 34 to substrate pad 15, according to an embodiment of the present invention. Using an automated chip join alignment tool, pillar 17 with solder 18 and nanoparticle paste 34 can be aligned with substrate pad 15. In another embodiment, pillar 17 with solder 18 is aligned with substrate pad 15 with nanoparticle paste 34. In this embodiment, nanoparticle paste 34 is dispensed using syringe 40 as discussed with respect to FIG. 4B.

Figure 8B:
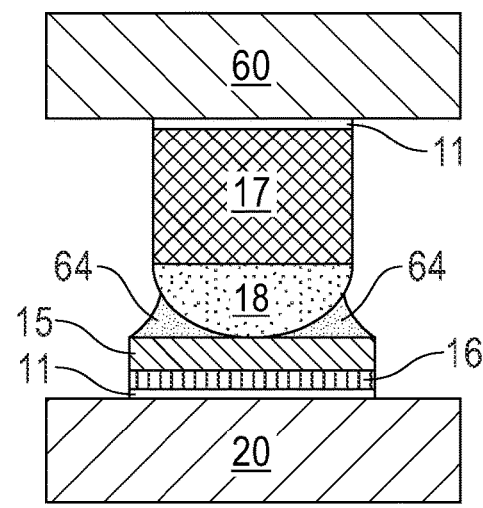
FIG. 8B is the solder coated pillar with the nanoparticle paste after sintering the nanoparticle paste to join the solder coated pillar to the substrate pad, according to an embodiment of the present invention.

FIG. 8B is pillar 17 with solder 18 and nanoparticle paste 34 connects to substrate pad 15 by sintered nanoparticles 64, according to an embodiment of the present invention. A chip to chip connection of semiconductor chip 60 to substrate 20 may occur upon sintering nanoparticle paste 34. Using one or more of the processes discussed with respect to steps 202-208 in FIG. 2, solder 18 on pillar 17 connects to substrate bond pad 15 by sintered nanoparticles 64.

The flowchart and block diagrams in the Figures illustrate the methods of semiconductor chip attach using the sintering of a nanoparticle paste according to various embodiments of the present invention. In this regard, each block in the flowchart or block diagrams may represent a step or a portion of the semiconductor chip join process. In some alternative implementations, the functions noted in the blocks may occur out of the order noted in the Figures.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein. Aspects of the present invention are described herein with reference to flowchart illustrations and/or block diagrams of methods and/or the various components of the apparatus according to embodiments of the invention.

What is claimed is:
1. A method comprising:
 depositing a nanoparticle paste on a solder bump, wherein:
  the nanoparticle paste has nanoparticles with a diameter less than two nanometers;
  the solder bump is on a semiconductor chip; and
  the solder bump is composed of a lead-free solder;

subsequent to depositing the nanoparticle paste on the solder bump, aligning and placing the solder bump with the nanoparticle paste on a copper bond pad on a flex cable, wherein the copper bond pad is over a diffusion barrier on the semiconductor chip; and sintering in a reducing gaseous environment, the nanoparticle paste to connect the solder bump to the bond pad on the flex cable.

2. The method of claim 1, wherein the nanoparticle paste is composed of a solder alloy in at least a carrier.

3. The method of claim 2, wherein the solder alloy forming the nanoparticles in the nanoparticle paste is composed of an alloy of tin and silver.

4. The method of claim 1, wherein the nanoparticle paste includes gold nanoparticles.

5. The method of claim 1, wherein the sintering in the reducing gaseous environment includes applying pressure to a selection from the group consisting of: the semiconductor chip and the flex cable.

6. The method of claim 1, wherein the sintering in the reducing gaseous environment includes a gas environment selected from the group consisting of: a forming gas environment and a formic acid gas environment.

7. The method of claim 6, wherein subsequent to the sintering in the reducing gaseous environment of silver nanoparticles in the nanoparticle paste occurring at a temperature of 180 degrees Celsius, a chip joint has a resistance of 10 $\mu\Omega$-cm or less. diffusion barrier on the semiconductor chip.

8. The method of claim 1, further comprising depositing additional nanoparticle paste by a process of screening the additional nanoparticle paste on the copper bond pad.

9. The method of claim 1, wherein the solder bump is on a copper pad on the semiconductor chip formed by back end of line semiconductor processes without gold plating.

10. The method of claim 1, wherein the nanoparticle paste includes at least a combination of tin nanoparticles and silver nanoparticles.

* * * * *